US012672343B2

(12) United States Patent
Dainese et al.

(10) Patent No.: US 12,672,343 B2
(45) Date of Patent: Jun. 30, 2026

(54) RC-IGBT AND MANUFACTURING METHOD OF RC-IGBT

(71) Applicant: Infineon Technologies Austria AG, Villach (AT)

(72) Inventors: Matteo Dainese, Munich (DE); Ahmed Elsayed, Dresden (DE); Aleksander Hinz, Dresden (DE); Christian Philipp Sandow, Haar (DE)

(73) Assignee: Infineon Technologies Austria AG, Villach (AT)

( * ) Notice: Subject to any disclaimer, the term of this patent is extended or adjusted under 35 U.S.C. 154(b) by 372 days.

(21) Appl. No.: 18/483,826

(22) Filed: Oct. 10, 2023

(65) Prior Publication Data

US 2024/0136353 A1 Apr. 25, 2024
US 2024/0234414 A9 Jul. 11, 2024

(30) Foreign Application Priority Data

Oct. 19, 2022 (DE) .......................... 102022127527.2

(51) Int. Cl.
*H10D 84/80* (2025.01)
*H10D 12/00* (2025.01)
(Continued)

(52) U.S. Cl.
CPC ......... *H10D 84/811* (2025.01); *H10D 12/481* (2025.01); *H10D 62/393* (2025.01); *H10D 64/231* (2025.01); *H10D 62/102* (2025.01)

(58) Field of Classification Search
CPC .. H10D 84/811; H10D 12/481; H10D 62/393; H10D 64/231; H10D 62/102;
(Continued)

(56) References Cited

U.S. PATENT DOCUMENTS 11,984,473 B2 * 5/2024 Matsudai ............... H10D 8/422
2014/0084337 A1 3/2014 Matsudai et al.
(Continued)

FOREIGN PATENT DOCUMENTS

CN 103117302 A 5/2013
DE 102021107989 A1 12/2021
WO 2016080269 A1 5/2016

*Primary Examiner* — Thanh T Nguyen
(74) *Attorney, Agent, or Firm* — Murphy, Bilak & Homiller, PLLC

(57) ABSTRACT

A reverse conducting insulated gate bipolar transistor (RC-IGBT) includes an active area in a semiconductor body. The active area includes an IGBT area, a diode area, a transition area laterally adjacent to the diode area, trenches extending into the semiconductor body from a first surface of the semiconductor body, and a drift region of a first conductivity type that includes lifetime killing impurities in the transition area. The active area further includes a barrier region of the first conductivity type between the drift region and the first surface. A maximum doping concentration in the barrier region is at least 100 times larger than an average doping concentration in the drift region. The barrier region laterally extends through at least part of the transition area, and laterally ends in or before the diode area. The RC-IGBT further includes an edge termination area at least partly surrounding the active area.

21 Claims, 3 Drawing Sheets

(51) Int. Cl.
H10D 62/10 (2025.01)
H10D 62/17 (2025.01)
H10D 64/23 (2025.01)

(58) Field of Classification Search
CPC .... H10D 8/422; H10D 62/834; H10D 62/127;
H10D 62/142; H10D 64/117
See application file for complete search history.

(56) References Cited

U.S. PATENT DOCUMENTS

| 2019/0287961 | A1 | 9/2019 | Naito | |
| 2019/0287962 | A1 | 9/2019 | Naito | |
| 2020/0058735 | A1 | 2/2020 | Naito | |
| 2021/0083081 | A1 | 3/2021 | Laven et al. | |
| 2021/0398811 | A1* | 12/2021 | Kamimura | H10D 8/422 |
| 2022/0139908 | A1 | 5/2022 | Obata et al. | |
| 2022/0199614 | A1* | 6/2022 | Pfirsch | H10D 64/117 |
| 2023/0261056 | A1* | 8/2023 | Honda | H10D 8/422 |
| | | | | 257/140 |
| 2024/0006520 | A1* | 1/2024 | Naito | H10D 64/117 |

* cited by examiner

RC-IGBT AND MANUFACTURING METHOD OF RC-IGBT

TECHNICAL FIELD

The present disclosure relates to a reverse conducting insulated gate bipolar transistor, RC-IGBT, in particular to an RC-IGBT having a transition area arranged between a diode area and an edge termination area of the RC-IGBT.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters. A power semiconductor device typically includes a semiconductor body configured to conduct a forward load current along a load current path between two load terminals of the device. Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

Some power semiconductor devices further provide for a reverse conductivity. During a reverse conducting state, the power semiconductor device conducts a reverse load current. Such devices may be designed such that the forward load current capability (in terms of magnitude) is substantially the same as the reverse load current capability.

A typical device that provides for both forward and revers load current capability is the reverse RC-IGBT, the general configuration of which is known to the skilled person. Typically, for an RC-IGBT, the forward conducting state is controllable by means of providing a corresponding signal to the gate electrodes, and the reverse conducting state is typically not controllable, but the RC-IGBT assumes the reverse conducting state if a reverse voltage is present at the load terminals due to a corresponding diode structure in the RC-IGBT.

It is desirable to provide an RC-IGBT with a high degree of controllability and robustness in addition to a high efficiency in terms of power losses.

SUMMARY

An example of the present disclosure relates to a reverse conducting insulated gate bipolar transistor, RC-IGBT. The RC-IGBT comprises an active area in a semiconductor body. The active area comprises an IGBT area, a diode area, and a transition area laterally adjacent to the diode area. The active area further includes a plurality of trenches extending into the semiconductor body from a first surface of the semiconductor body. The first surface is opposite to a second surface of the semiconductor body. The active area further includes a drift region of a first conductivity type, wherein the drift region includes lifetime killing impurities in the transition area. The active area further includes a barrier region of the first conductivity type between the drift region and the first surface. A maximum doping concentration in the barrier region is at least 100 times larger than an average doping concentration in the drift region. The barrier region laterally extends through at least part of the transition area, and laterally ends in or before the diode area. The RC-IGBT further includes an edge termination area at least partly surrounding the active area.

Another example of the present disclosure relates to a method of manufacturing a reverse conducting insulate gate bipolar transistor, RC-IGBT. The method comprises forming an active area in a semiconductor body. The active area comprises an IGBT area, a diode area, and a transition area laterally adjacent to the diode area. A plurality of trenches extends into the semiconductor body from a first surface of the semiconductor body. The first surface is opposite to a second surface of the semiconductor body. The active area further includes a drift region of a first conductivity type. The drift region includes lifetime killing impurities in the transition area. The active area further includes a barrier region of the first conductivity type between the drift region and the first surface. A maximum doping concentration in the barrier region is at least 100 times larger than an average doping concentration in the drift region. The barrier region laterally extends through at least part of the transition area, and laterally ends in or before the diode area. The method further includes forming an edge termination area at least partly surrounding the active area.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of RC-IGBTs and together with the description serve to explain principles of the examples. Further examples are described in the following detailed description and the claims.

DETAILED DESCRIPTION

Figure 1:
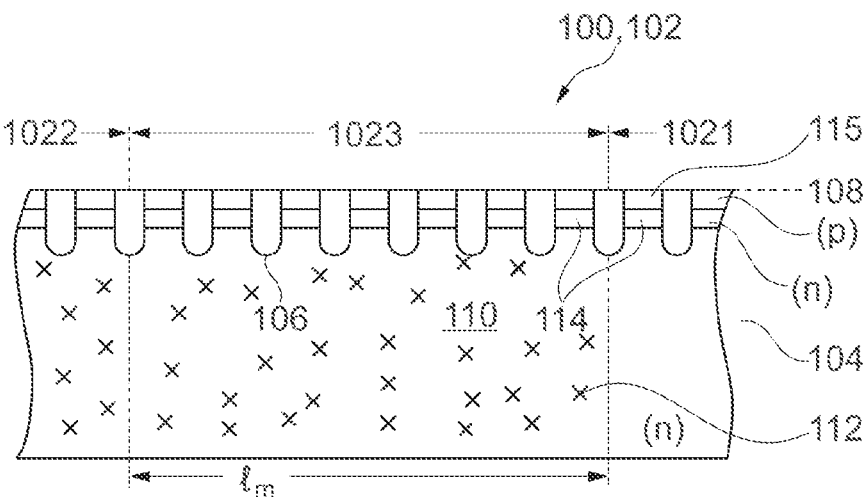
FIG. 1 is a schematic cross-sectional view for illustrating an example of a RC-IGBT including an IGBT area, a diode area, and a transition area laterally adjacent to the diode area.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" may describe a permanent low-resistive connection between electrically connected elements, for example a direct contact between the concerned elements or a low-resistive connection via a metal and/or heavily doped semiconductor material. The term "electrically coupled" may include that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact may be a non-rectifying electrical junction.

Ranges given for physical dimensions include the boundary values. For example, a range for a parameter y from a to b reads as a y b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a reverse conducting insulated gate bipolar transistor, RC-IGBT, comprises an active area in a semiconductor body. The active area may comprise an IGBT area, a diode area, and a transition area laterally adjacent to the diode area. The active area may further include a plurality of trenches extending into the semiconductor body from a first surface of the semiconductor body. The first surface is opposite to a second surface of the semiconductor body. The active area may further include a drift region of a first conductivity type. The drift region may include lifetime killing impurities in the transition area. The active area may further include a barrier region of the first conductivity type between the drift region and the first surface. A maximum doping concentration in the barrier region may be at least 100 times larger than an average doping concentration in the drift region. The barrier region may laterally extend through at least part of the transition area, and may laterally end in or before the diode area. The RC-IGBT further includes an edge termination area that may at least partly surround the active area.

The RC-IGBT may be part of an integrated circuit, or may be a discrete semiconductor device or a semiconductor module, for example. The RC-IGBT may be or may include a power semiconductor device, e.g. a vertical power semiconductor device having a load current flow between the first surface and the second surface. The RC-IGBT may be or may include a power semiconductor RC-IGBT. The power RC-IGBT may be configured to conduct currents of more than 1 A or more than 10 A or even more than 30 A, and may be further configured to block voltages between load terminals, e.g. between emitter and collector, in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be or may include a semiconductor substrate (having none, one or even more semiconductor layers such as epitaxial semiconductor layers on the semiconductor substrate). The semiconductor substrate may be a Czochralski (CZ), e.g. a magnetic Czochralski, MCZ, or a float zone (FZ), or an epitaxially deposited silicon semiconductor substrate.

The first surface may be a front surface or a top surface of the RC-IGBT, and the second surface may be a back surface or a rear surface of the RC-IGBT, for example. The semiconductor body may be attached to a lead frame via the second main surface, for example. Over the first main surface of the semiconductor substrate, bond pads may be arranged and bond wires may be bonded on the bond pads.

For realizing a desired current carrying capacity, the RC-IGBT may be designed by a plurality of parallel-connected IGBT and/or diode cells. The parallel-connected IGBT and/or diode cells may, for example, be IGBT and/or diode cells formed in the shape of a strip or a strip segment. The IGBT and/or diode cells can also have any other shape, e.g. circular, elliptical, polygonal such as hexagonal or octahedral. For example, the IGBT cells may be arranged in the IGBT area, and the diode cells may be arranged in the diode area. The IGBT and/or diode cells may be arranged in the active area of the RC-IGBT. The active area may be defined by an area of the semiconductor body where an emitter region of the IGBT cells at the first surface and a collector region of the IGBT cells are arranged opposite to one another along the vertical direction. The active area may also include an area of the semiconductor body where an anode region of the diode cells at the first surface and a cathode region of the diode cells are arranged opposite to one another along the vertical direction. In the active area, a load current may enter or exit the semiconductor body of the RC-IGBT, e.g. via contact plugs on the first surface of the semiconductor body. For example, the active area may be defined by an area where contact plugs are placed over the first surface for electrically connecting an electrode on the first surface to any semiconductor layers in the IGBT area, or the diode area, or the transition area.

The transition area may differ from the IGBT area by at least one structural feature in the semiconductor body. For example, an emitter or source region may be present in the IGBT area but absent, at least in part of, the transition area. In addition or as an alternative, a pitch between neighboring trenches in the transition area may be different from a pitch between neighboring trenches in the IGBT area, for example. In addition or as an alternative, the lifetime killing impurities may be present in the transition area but be absent in, at least in part of, the IGBT area. The transition area may also differ from the diode area by at least one structural feature in the semiconductor body. For example, the barrier region may be present in the transition area but be absent in, at least in part of, the diode area. In addition or as an alternative, a pitch between neighboring trenches in the transition area may be different from a pitch between neighboring trenches in the diode area, for example.

The edge termination area may include a termination structure. In a blocking mode or in a reverse biased mode of the RC-IGBT, the blocking voltage between the transistor cell area and a field-free region laterally drops across the termination structure in the edge termination area. The termination structure may have a higher or a slightly lower voltage blocking capability than the transistor cell area. The termination structure may include a junction termination extension (JTE) with or without a variation of lateral doping (VLD), one or more laterally separated guard rings, or any combination thereof, for example.

The blocking voltage of the RC-IGBT may be adjusted along a vertical direction perpendicular to the first surface by adjusting parameters of the drift region, e.g. vertical extent and/or doping profile. The drift region may turn into the barrier region, for example. An impurity or doping concentration in the drift region may gradually or in steps increase or decrease with increasing distance to the first surface at least in portions of its vertical extension. According to other examples the impurity concentration in the drift region may be approximately uniform in vertical direction. For RC-IGBTs based on silicon, a mean impurity concentration in the drift region may be between $5 \times 10^{12}$ cm$^{-3}$ and $1 \times 10^{15}$ cm$^{-3}$, for example in a range from $1 \times 10^{13}$ cm$^{-3}$ to $2 \times 10^{14}$ cm$^{-3}$. In the case of an RC-IGBT based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device. When operating the vertical power semiconductor device at or close to the specified maximum blocking voltage, the space charge region may reach or penetrate into a field stop region. The field stop region is configured to prevent the space charge region from further reaching to the cathode or collector at the second surface of the semiconductor body.

For example, some or all of the plurality of trenches may be filled by a trench structure. The trench structure may include a dielectric and an electrode. For example, the dielectric may be a gate dielectric in the IGBT area, e.g. a thermal and/or deposited oxide such as $SiO_2$. For example, the electrode may be a gate electrode in the IGBT area and may be electrically connected to a control terminal, e.g. a gate terminal, of the RC-IGBT. The gate terminal as well as other terminals of the RC-IGBT, e.g. an emitter terminal or emitter electrode or an anode terminal or anode electrode, may be formed in a wiring area over the first surface of the semiconductor body that may include one or more than one, e.g. two, three, four or even more wiring levels. Each wiring level may be formed by a single one or a stack of conductive layers, e.g. metal layer(s) and/or highly doped semiconductor layer(s) (e.g. highly doped polycrystalline layers). For example, the wiring levels may include at least one of Cu, Au, AlCu, Ag, or alloys thereof. The wiring levels may be lithographically patterned, for example. Between stacked wiring levels, an interlayer dielectric structure may be formed. Openings may be formed in the interlayer dielectric structure for electrically interconnecting different wiring layers. For example, contact plug(s), or contact via(s) or contact line(s) may be formed in the openings in the interlayer dielectric structure to electrically connect parts, e.g. metal lines or contact areas, of different wiring levels to one another.

By providing the transition area that includes the barrier region and the lifetime killing impurities, a number of technical benefits may be achieved. Since the IGBT area may contribute to the diode behavior, e.g. IGBT cells close to the diode area may act as an anode, introduction of the transition area may counteract or reduce undesired diode behavior by the IGBT area caused by spatial separation of the diode area and the IGBT area via the transition area. In addition, the lifetime killing in the transition allows for further strengthening de-coupling between the diode area and the IGBT area. This may allow for increasing the degree of controllability and robustness in addition to a high efficiency in terms of power losses.

For example, the lifetime killing impurities may laterally extend through at least a predominant part of the diode area. For example, the lifetime killing impurities may laterally extend through more than 50%, or more than 60%, or more than 70%, or even more than 80% of the diode area. The lifetime killing impurities may laterally extend through all of the diode area, for example.

For example, the lifetime killing impurities may laterally extend from the transition area into the IGBT area. Although introduction of the lifetime killing impurities into the semiconductor body may be limited to the transition area and the diode area, e.g. by a masked ion implantation process, lateral diffusion may cause lifetime killing impurities to reach into the IGBT area and/or the edge termination area.

For example, a concentration of the lifetime killing impurities in the IGBT area may be smaller than in the diode area. For example, the concentration of the lifetime killing impurities may decrease in the IGBT area with increasing distance to the transition area. This may be caused by a lateral diffusion process of the lifetime killing impurities from the transition area into the IGBT area, for example.

For example, a lateral pitch between two adjacent trenches of the plurality of trenches in the diode area may be larger than in the IGBT area.

For example, a lateral pitch between two adjacent trenches of the plurality of trenches in the diode area may be equal to a lateral pitch between two adjacent trenches of the plurality of trenches in the transition area.

For example, a lateral extent of the transition area may range from 10% to 30% of a thickness of the semiconductor body between the first and second surface. The lateral extent of the transition area may range from 15% to 20% of a thickness of the semiconductor body between the first and second surface. This may allow for a beneficial switching efficiency of the RC-IGBT, for example.

For example, the RC-IGBT may further comprise a cathode region of the first conductivity type that is arranged in the diode area between the drift region and the second surface. The cathode region may laterally extend into at least part of the transition area. Since the lifetime killing impurities in the transition area help to reduce the parasitic effect of the IGBT area acting as an anode and expanding the plasma beyond the drift region volume in the diode area, the cathode region can be expanded into the transition area, for example. For example, the cathode region may even laterally extend into the entire transition area.

For example, the RC-IGBT may further comprise a collector region of the second conductivity type arranged in the IGBT area between the drift region and the second surface. The collector region may comprise an arrangement of first and second sub-regions alternating along a lateral direction. The first sub-region may have a larger maximum doping concentration than the second sub-region. For example, the maximum doping concentration in the first sub-region may be at least a factor of 10, or a factor of 100, or even a factor of 1000, larger than the maximum doping concentration in the second sub-region. A minimum lateral extension of the first sub-region may be constant with respect to the first sub-regions or may vary with respect to some or all of the first sub-regions. Likewise, a minimum lateral extension of the second sub-region may be constant with respect to the second sub-regions or may vary with respect to some or all of the second sub-regions.

For example, the collector region may further include a third sub-region in the IGBT area that is laterally confined by the transition area and the arrangement of alternating first and second sub-regions. The third sub-region may have a smaller maximum doping concentration than the first sub-region. A minimum lateral extension, e.g. width, of the third sub-region may be smaller than or equal to the minimum lateral extension, e.g. width, of the second sub-region, for example.

For example, each of the first and second sub-regions may be i) stripe-shaped along a first lateral direction in a first part of the IGBT area, and ii) stripe-shaped along a second lateral direction in a second part of the IGBT area. For example, the stripe-shaped sub-regions may be incident perpendicularly to the diode area. In other words, the stripe-shaped sub-regions may be incident perpendicular to a transition line or perimeter between the diode area and the transition area. For example, the first lateral direction may be perpendicular to the second lateral direction.

For example, the transition area may be laterally confined by the diode area and the edge termination area.

For example, the RC-IGBT may further comprise a doped region of the second conductivity type in the transition area that is arranged between the drift region and the second surface. The doped region may laterally adjoin, at a first position, to a part of the cathode region that extends into the transition area.

For example, a lateral distance between the first position and the edge termination area may range from 30 μm to 100 μm.

For example, the doped region may laterally extend into the edge termination area.

For example, the edge termination area may further include a doped well region of the second conductivity type adjoining to the first surface. A depth of the doped well region may be larger than a depth of the plurality of trenches. The depth of the doped well region may also be larger than a depth of the barrier region.

For example, a lateral pitch between two adjacent trenches of the plurality of trenches in the transition area may decrease toward the edge termination area.

Details with respect to structure, or function, or technical benefit of features described above with respect to a RC-IGBT likewise apply to the exemplary methods described herein. Processing the semiconductor body may comprise one or more optional additional features corresponding to one or more aspects mentioned in connection with the proposed concept or one or more examples described above or below.

An example of a method of manufacturing a reverse conducting insulate gate bipolar transistor, RC-IGBT, may comprise forming an active area in a semiconductor body. The active area may include an IGBT area, a diode area, and a transition area laterally adjacent to the diode area. The active area may further include a plurality of trenches extending into the semiconductor body from a first surface of the semiconductor body. The first surface is opposite to a second surface of the semiconductor body. The active area further includes a drift region of a first conductivity type. The drift region may include lifetime killing impurities in the transition area. The active area may further include a barrier region of the first conductivity type between the drift region and the first surface. A maximum doping concentration in the barrier region may be at least 100 times larger than an average doping concentration in the drift region. The barrier region may laterally extend through at least part of the transition area, and may laterally end in or before the diode area. The method may further include forming an edge termination area at least partly surrounding the active area.

The examples and features described above and below may be combined.

Functional and structural details described with respect to the examples above shall likewise apply to the exemplary examples illustrated in the figures and described further below.

More details and aspects are mentioned in connection with the examples described above or below. The description and drawings merely illustrate the principles of the disclosure. Furthermore, all examples recited herein are principally intended expressly to be only for illustrative purposes to aid the reader in understanding the principles of the disclosure and the concepts contributed by the inventor (s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIG. 1 schematically and exemplarily illustrates an example of an active area 102 of a RC-IGBT 100.

The active area 102 includes an IGBT area 1021, a diode area 1022, and a transition area 1023. The transition area is arranged laterally adjacent to the diode area 1022. A plurality of trenches 106 extend into the semiconductor body 104 from a first surface 108 of the semiconductor body 104. The first surface 108 is opposite to a second surface 109 of the semiconductor body 104.

The active area 102 further includes an n-doped drift region 110. The drift region 110 includes lifetime killing impurities 112 in the transition area 1023. The lifetime killing impurities 112 may act as recombination centers. For example, the lifetime killing impurities 112 may be metal impurities, e.g. Pt, or any other element or complex that is configured to reduce the lifetime of charge carriers in the drift zone, e.g. minority carriers. The lifetime killing impurities 112 laterally extend through at least a predominant part of the diode area. For example, the lifetime killing impurities 112 diffuse to at least ⅓ of the thickness of the drift region 110, up to beyond the thickness of the device (the diffusion may be carried out before the semiconductor body, e.g. wafer, is thinned to a target thickness). In one example, the lifetime killing impurities 112 extend through the entire thickness of the drift region 110 in the transition area 1023 but also in the IGBT area 1021, the diode area 1022 and/or the edge termination area 1024. The active area further includes a p-doped region 115. The p-doped region 115 is arranged in each of the IGBT area 1021, diode area 1022, and the transition area 1023. The p-doped region 115 may act as a body region in the IGBT area 1021 and may likewise act as an anode region in the diode area 1022, for example.

The active area 102 further includes an n-doped barrier region 114 type between the p-doped region 115 and the drift region 110. A maximum doping concentration in the barrier region 114 is at least 100 times larger than an average doping concentration in the drift region 110. The barrier region 114 laterally extends through the transition area 1023, and laterally ends at a transition to the diode area 1022.

A lateral extent lm of the transition area 1023 ranges from 10% to 30% of a thickness d of the semiconductor body 104 between the first and second surface 108, 109.

The RC-IGBT 100 further includes a plurality of trenches 106 extending into the semiconductor body 104 from the first surface 108.

Figure 2:
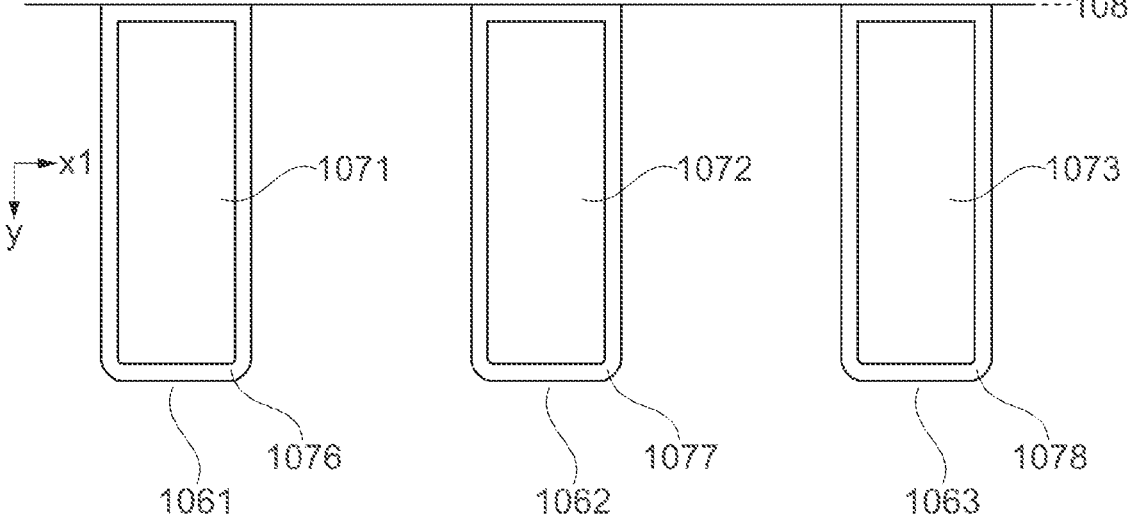
FIG. 2 illustrates exemplary trench structures in each of the IGBT area, the diode area, and the transition area of an RC-IGBT.

Now also referring to FIG. 2, exemplary details are described with reference to the plurality of trenches 106 that may apply to any of the examples illustrated and/or described herein. The plurality of trenches 106 may include trench sub-types 1061, 1062, 1063 arranged in each of the IGBT area 1021, the diode area 1022, and the transition area 1023, each trench 1061, 1062, 1063 extending from the first surface 108 along a vertical direction y into the semiconductor body 104 and comprising a respective trench electrode 1071, 1072, 1073 electrically isolated from the semiconductor body 104 by a respective trench insulator 1076, 1077, 1078, wherein two adjacent trenches define a respective mesa portion in the semiconductor body 104.

Each trench 1061, 1062, 1063 may have a stripe configuration, meaning that the respective trench length (e.g., along a longitudinal direction of the trenches) is much greater than the respective trench width (e.g., along a first lateral direction x1).

The trench sub-type 1061 can be a control trench, whose trench electrode 1071 is electrically connected to a control terminal and is hence referred to as control electrode. The second sub-type 1062 can be a source or emitter trench, whose trench electrode 1072 is electrically connected to a first load terminal, e.g. source or emitter terminal, and is hence referred to as source or emitter electrode. The third trench sub-type 1063 can be another trench, whose trench electrode 1073 is neither electrically connected to the first load terminal nor to the control terminal. For example, third trench sub-type 1063 is a floating trench and the trench electrode 1073 is connected to no defined electrical potential, but electrically floating. In another example, third trench sub-type 1063 is a dummy trench and trench electrode 1073 is electrically connected to the control terminal but does not directly control conduction of the forward load current as no electrically connected source or emitter region (connected to the first load terminal) is arranged adjacent to third trench sub-type 1063. In yet another example, the trench electrode 1073 is connected to an electrical potential different from the electrical potential of the control terminal and different from the electrical potential of the first load terminal.

Each trench type can be of equal dimensions in terms of width (along the first lateral direction x1) and depth (along the vertical direction y, e.g., distance between first surface 108 down to trench bottom) and/or length (along the longitudinal direction).

The IGBT area 1021 may comprise a plurality of IGBT cells, each IGBT cell having a certain trench pattern, i.e., a lateral sequence of trenches of specific sub-types, e.g. one or more control trenches, zero or more source or emitter trenches and zero or more other trenches. Analogously, the diode area 1022 may comprise a plurality of diode cells, each diode cell having a certain trench pattern, i.e., a lateral sequence of trenches of specific types, e.g. one or more source or emitter trenches, zero or more other trenches and zero or more control trenches.

As indicated above, the trench sub-types 1061, 1062, 1063 are arranged with each of the diode area 1022, the IGBT area 1021 and the transition area 1023. In one example, the trench sub-types 1061, 1062, 1063 in each of the IGBT area 1021, the diode area 1022 and the transition area 1023 are laterally arranged next to one another in accordance with the same lateral trench pitch; i.e., the lateral trench pitch (that is, the distance between two adjacent trench centers) does not alter between the areas 1021, 1022, 1023. For example, the lateral trench pitch may define a lateral distance between two adjacent trenches of no more than ⅓₀ of the semiconductor body thickness d. In other words, the lateral widths of the mesa portions in each of the diode area 1022, the IGBT area 1021 and the transition area 1023 may be identical to each other.

Also, the trench sub-types 1061, 1062 may each exhibit the same trench depth (total vertical extension). For example, the lateral trench pitch may define a lateral distance between two adjacent trenches of no more than 50% or no more than 30% of the trench depth.

In an example, the lateral trench pitch may define a lateral distance between two adjacent trenches of no more than 10 μm, or no more than 5 μm, or no more than 1 μm. For example, adjacent trenches are hence laterally displaced from each other by no more than 1 μm. Hence, the width of each mesa portion is within the range as defined by the lateral trench pitch.

Figure 3:
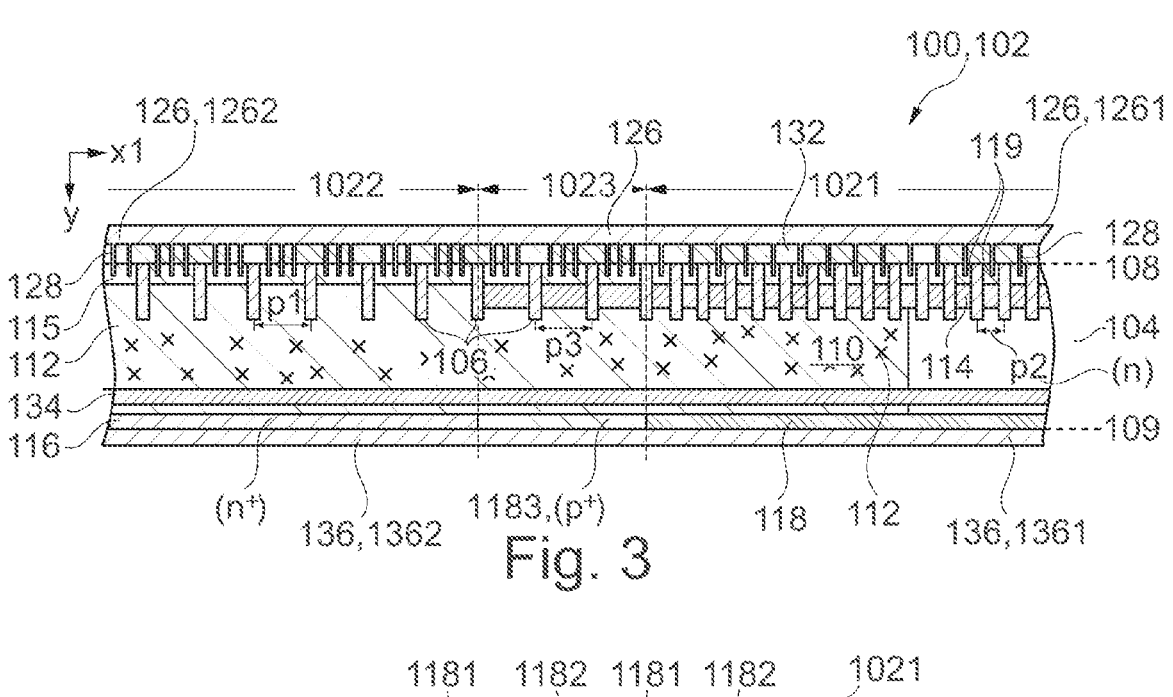
FIG. 3 is a schematic cross-sectional view for illustrating another example of a RC-IGBT including an IGBT area, a diode area, and a transition area laterally adjacent to the diode area.

The schematic cross-sectional view of FIG. 3 illustrates a more detailed view of an example of a RC-IGBT 100.

As is illustrated in FIG. 3, the lifetime killing impurities 112 laterally extend from the transition area 1023 into the IGBT area 1021. This may be due a lateral diffusion of the lifetime killing impurities 112 from the transition area 1023 into the IGBT area 1021.

A first load terminal 126, e.g. a metal layer in a wiring area over the first surface 108, is electrically connected to the IGBT area 1021, the transition area 1023, and the diode area 1022, by contact plugs 128. The first load terminal 126 comprises an emitter contact part 1261 in the IGBT area 1021, and further includes an anode contact part 1262 in the diode area 1022. The contact plugs 128 extend through an intermediate dielectric 132 arranged between the first surface 108 of the semiconductor body 104 and the first load terminal 126. An n-doped source or emitter region 119 adjoins to some of the trenches 106 in the IGBT area 1021, e.g. to trench sub-type 1061 (control trench) as described with reference to FIG. 2.

In the illustrated example, a lateral pitch p1 between two adjacent trenches of the plurality of trenches 106 in the diode area 1022 is equal to a lateral pitch p3 between two adjacent trenches of the plurality of trenches 106 in the transition area 1023. A lateral pitch p2 between two adjacent trenches of the plurality of trenches 106 in the IGBT area 1021 is smaller than the lateral pitch p1 between two adjacent trenches of the plurality of trenches 106 in the diode area 1022.

A concentration of the lifetime killing impurities 112 in the IGBT area 1021 is smaller than in the diode area 1022. This may be caused by a lateral diffusion of the lifetime killing impurities 112 from the transition area 1023 into the IGBT area 1021.

The RC-IGBT 100 further includes an n-doped field stop region 134 in the IGBT area 1021, the diode area 1022, and the transition area 1023.

The RC-IGBT 100 further includes an $n^+$-doped cathode region 116 that is arranged in the diode area 1022 between the drift region 110 and the second surface 109.

Figure 4:
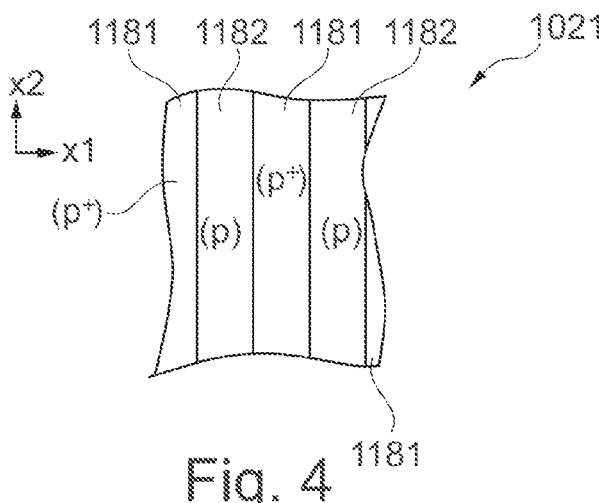
FIG. 4 is a schematic top view for illustrating an exemplary collector region design in the IGBT area.

The RC-IGBT 100 further includes a p-doped collector region 118 in the IGBT area 1021 between the drift region 110 and the second surface 109. Now also referring to FIG. 4, the collector region 118 comprises an arrangement of first and second sub-regions 1181, 1182 alternating along the first lateral direction x1, the first sub-region 1181 having a larger maximum doping concentration than the second sub-region 1182.

As is illustrated in FIG. 3, the collector region 118 further includes a third sub-region 1183 in the transition area 1023 that is laterally confined by the diode area 1022 and the arrangement of alternating first and second sub-regions 1181, 1182 in the IGBT area 1021. The third sub-region 1183 has a smaller maximum doping concentration than the first sub-region 1181.

A second load terminal 136, e.g. a metal layer, is arranged on the second surface 109 of the semiconductor body 104. The second load terminal 136 is electrically connected to the IGBT area 1021, the transition area 1023, and the diode area 1022. The second load terminal 136 comprises a collector contact part 1361 in the IGBT area 1021, and further includes a cathode contact part 1362 in the diode area 1022.

Figure 5:
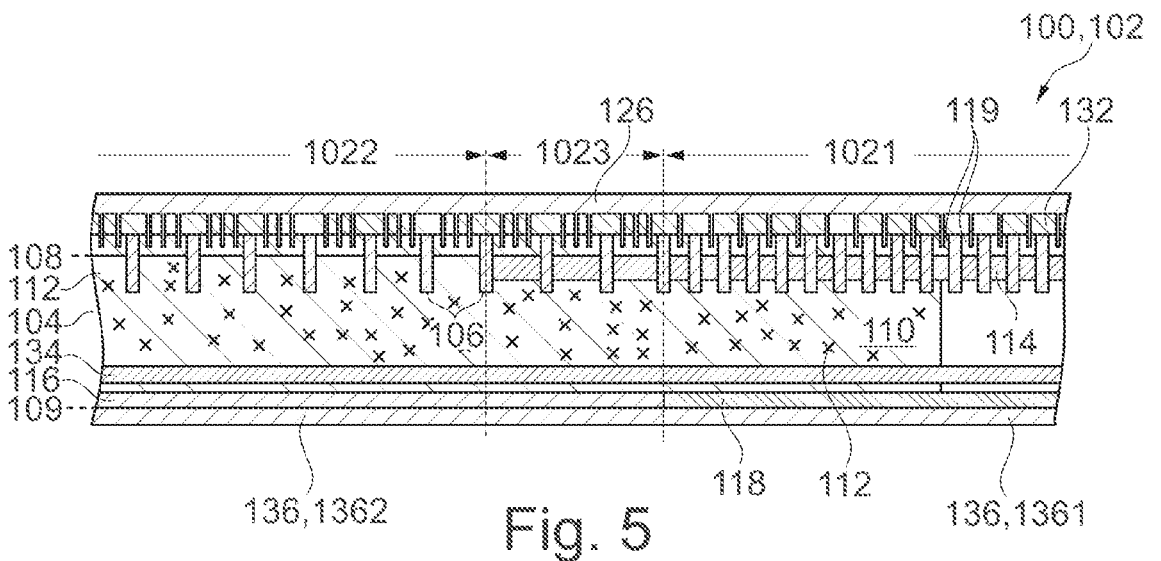
FIGS. 5 and 6 are schematic cross-sectional view for illustrating other examples of a RC-IGBT including an IGBT area, a diode area, and a transition area laterally adjacent to the diode area.

The schematic cross-sectional view of FIG. 5 illustrates another exemplary RC-IGBT 100. The RC-IGBT 100 differs from the RC-IGBT 100 of FIG. 3 in that the third sub-region 1183 in the transition area 1023 is replaced by the cathode region 116 that laterally extends from the diode area 1022 into the entire transition area 1023.

Figure 6:
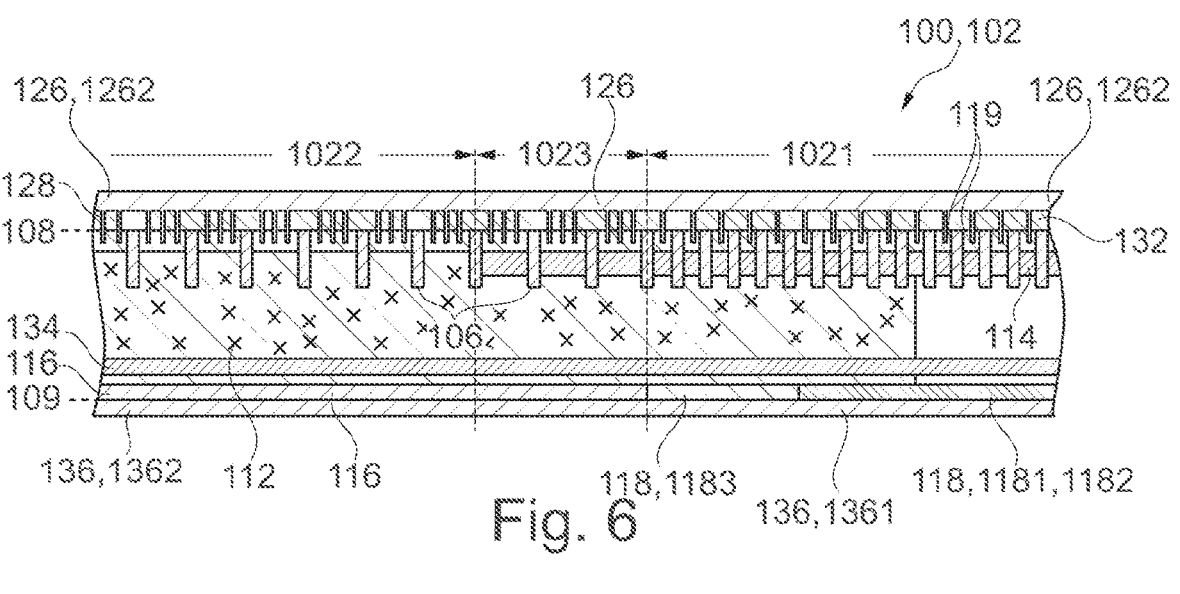

The schematic cross-sectional view of FIG. 6 illustrates another exemplary RC-IGBT 100. The RC-IGBT 100 differs from the RC-IGBT 100 of FIG. 3 in that the third sub-region 1183 in the transition area 1023 is shifted from the transition area 1023 into the IGBT area 1021 and replaced in the transition area 1023 by the cathode region 116 that laterally extends from the diode area 1022 into the entire transition area 1023.

Figures 7A, 7B:
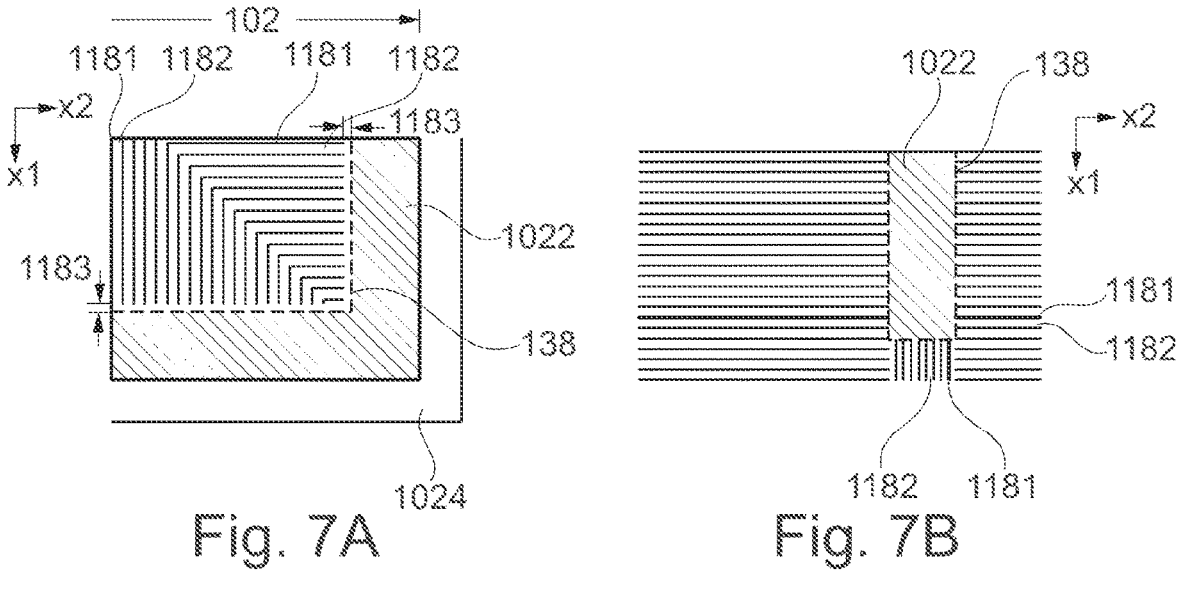
FIGS. 7A and 7B are schematic top views for illustrating exemplary collector region designs in the IGBT area.

The schematic plan views of FIGS. 7A and 7B are for illustrating exemplary designs of stripe-shaped first and second sub-regions 1181, 1182 in the IGBT area 1021. The stripe-shaped sub-regions 1181, 1182 are incident perpendicularly to the diode area 1022, i.e. the stripe-shaped sub-regions 1181, 1182 are incident perpendicular to a perimeter 138 between the diode area 1022 and the transition area 1023. An edge termination area 1024 surrounds the active area 102.

Figure 8:
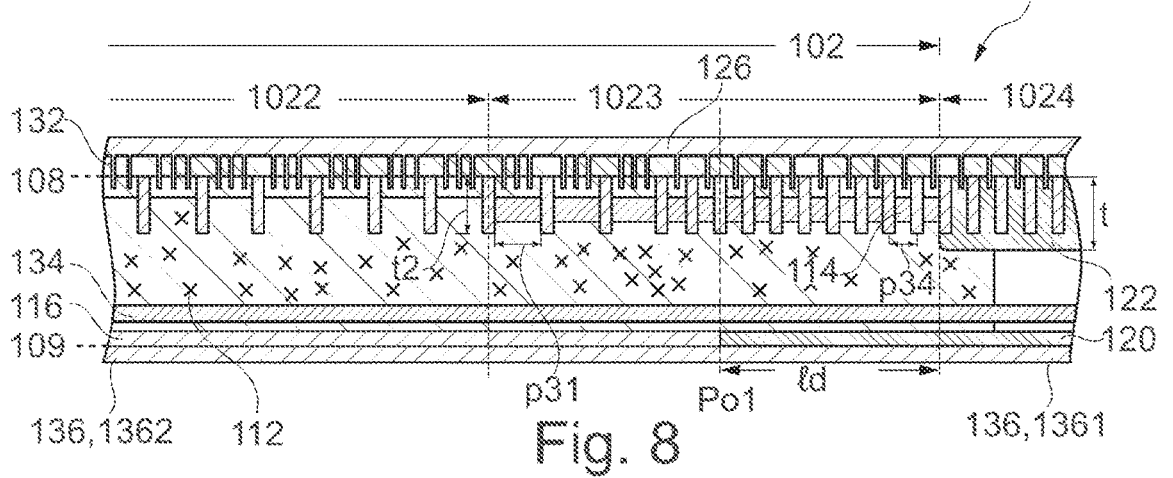
FIG. 8 is a schematic cross-sectional view for illustrating another example of a RC-IGBT including an IGBT area, a diode area, and a transition area laterally adjacent to the diode area.

The schematic cross-sectional view of FIG. 8 illustrates another exemplary RC-IGBT 100. The diode area 1022 turns into the edge termination area 1024 via the transition area 1023. The cathode region 116 laterally extends from the diode area 1022 into a first part of the transition area 1023. In a second part of the transition area 1023, the RC-IGBT 100 further includes a p-doped region 120 that is arranged between the drift region 102 and the second surface 109. The p-doped region 120 is designed with low doping activation. The p-doped region 120 has a doping concentration equal or similar to the sub-region 1182 of the collector 118 of the RC-IGBT 100 in order to minimize the leakage current in the region of the edge terminations (PNP bipolar gain) and minimal interaction with the free carrier plasma of the diode during the diode turn OFF process. The p-doped region 120 laterally adjoins, at a first position, Po1, to the part of the cathode region 116 that extends into the transition area 1023. A lateral distance Id between the first position Po1 and the edge termination area 1024 may range from 30 μm to 100 μm, for example. The p-doped region 120 laterally extends into the edge termination area 1024. The edge termination area 1024 further includes a p-doped well region 122 adjoining to the first surface 108. A depth t1 of the p-doped well region 122 is larger than a depth t2 of the plurality of trenches 106. The p-doped well region 122 constitutes the beginning of the edge termination construction, in the direction of the chip edge. The p-doped well region 122, by being deeper than the trench depth, counteracts high electric field concentrations at the location where the trench arrangement abruptly ends.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A reverse conducting insulated gate bipolar transistor (RC-IGBT), comprising:

an active area in a semiconductor body, the active area comprising:

an IGBT area, a diode area, and a transition area laterally adjacent to the diode area;

a plurality of trenches extending into the semiconductor body from a first surface of the semiconductor body, the first surface being opposite to a second surface of the semiconductor body;

a drift region of a first conductivity type, wherein the drift region includes lifetime killing impurities in the transition area;

a barrier region of the first conductivity type between the drift region and the first surface, wherein a maximum doping concentration in the barrier region is at least 100 times larger than an average doping concentration in the drift region, and wherein the barrier region laterally extends through at least part of the transition area, and laterally ends in or before the diode area; and an edge termination area at least partly surrounding the active area.

2. The RC-IGBT of claim 1, wherein the lifetime killing impurities laterally extend through at least a predominant part of the diode area.

3. The RC-IGBT of claim 1, wherein the lifetime killing impurities laterally extend from the transition area into the IGBT area.

4. The RC-IGBT of claim 1, wherein a concentration of the lifetime killing impurities in the IGBT area is smaller than in the diode area.

5. The RC-IGBT of claim 1, wherein a lateral pitch between two adjacent trenches of the plurality of trenches in the diode area is larger than in the IGBT area.

6. The RC-IGBT of claim 1, wherein a lateral pitch between two adjacent trenches of the plurality of trenches in the diode area is equal to a lateral pitch between two adjacent trenches of the plurality of trenches in the transition area.

7. The RC-IGBT of claim 1, wherein a lateral extent of the transition area ranges from 10% to 30% of a thickness of the semiconductor body between the first surface and the second surface.

8. The RC-IGBT of claim 1, further comprising:

a cathode region of the first conductivity type arranged in the diode area between the drift region and the second surface, wherein the cathode region laterally extends into at least part of the transition area.

9. The RC-IGBT of claim 8, wherein the cathode region laterally extends into the entire transition area.

10. The RC-IGBT of claim 1, further comprising:

a collector region of the second conductivity type arranged in the IGBT area between the drift region and the second surface, wherein the collector region comprises an arrangement of first and second sub-regions alternating along a lateral direction, the first sub-regions having a larger maximum doping concentration than the second sub-regions.

11. The RC-IGBT of claim 10, wherein the collector region further includes a third sub-region in the IGBT area that is laterally confined by the transition area and the arrangement of alternating first and second sub-regions, and wherein the third sub-region has a smaller maximum doping concentration than the first sub-region.

12. The RC-IGBT of claim 11, wherein each of the first and second sub-regions is stripe-shaped along a first lateral direction in a first part of the IGBT area and is stripe-shaped along a second lateral direction in a second part of the IGBT area.

13. The RC-IGBT of claim 12, wherein the first lateral direction is perpendicular to the second lateral direction.

14. The RC-IGBT of claim 1, wherein the transition area is laterally confined by the diode area and the edge termination area.

15. The RC-IGBT of claim 14, further comprising a doped region of the second conductivity type in the transition area that is arranged between the drift region and the second surface, wherein the doped region laterally adjoins, at a first position, to a part of a cathode region of the first conductivity type arranged in the diode area between the drift region and the second surface, wherein the cathode region laterally extends into at least part of the transition area.

16. The RC-IGBT of claim 15, wherein a lateral distance between the first position and the edge termination area ranges from 30 μm to 100 μm.

17. The RC-IGBT of claim 15, wherein the doped region laterally extends into the edge termination area.

18. The RC-IGBT of claim 14, wherein the edge termination area further includes a doped well region of the second conductivity type adjoining to the first surface, wherein a depth of the doped well region is larger than a depth of the plurality of trenches.

19. The RC-IGBT of claim 14, wherein a lateral pitch between two adjacent trenches of the plurality of trenches in the transition area decreases toward the edge termination area.

20. The RC-IGBT of claim 1, wherein the lifetime killing impurities extend through an entire thickness of the drift region.

21. A method of manufacturing a reverse conducting insulate gate bipolar transistor (RC-IGBT), the method comprising:

forming an active area in a semiconductor body, the active area comprising:

an IGBT area, a diode area, and a transition area laterally adjacent to the diode area;

a plurality of trenches extending into the semiconductor body from a first surface of the semiconductor body, the first surface being opposite to a second surface of the semiconductor body;

a drift region of a first conductivity type, wherein the drift region includes lifetime killing impurities in the transition area;

a barrier region of the first conductivity type between the drift region and the first surface, wherein a maximum doping concentration in the barrier region is at least 100 times larger than an average doping concentration in the drift region, and wherein the barrier region laterally extends through at least part of the transition area, and laterally ends in or before the diode area; and forming an edge termination area at least partly surrounding the active area.

* * * * *